United States Patent [19]

Shimada

[11] Patent Number: 5,451,888

[45] Date of Patent: Sep. 19, 1995

[54] DIRECT COUPLED FET LOGIC TRANSLATOR CIRCUIT

[75] Inventor: Masaaki Shimada, Itami, Japan

[73] Assignee: Mitsubishi Denki Kabushiki Kaisha, Tokyo, Japan

[21] Appl. No.: 137,774

[22] Filed: Oct. 19, 1993

[30] Foreign Application Priority Data

Dec. 15, 1992 [JP] Japan .................................. 4-354579

[51] Int. Cl.$^6$ .................................. H03K 19/0175
[52] U.S. Cl. .................................. 326/80; 326/117
[58] Field of Search .................................. 307/475, 450, 443

[56] References Cited

U.S. PATENT DOCUMENTS

| | | | |
|---|---|---|---|
| 4,707,622 | 10/1987 | Takeo | 307/475 |
| 4,743,782 | 5/1988 | Nelson | 307/475 |
| 4,897,565 | 1/1990 | Shimizu | 307/475 |
| 5,043,607 | 8/1991 | Danckaert | 307/450 |
| 5,107,144 | 4/1992 | Hiryama | 307/475 |
| 5,159,208 | 10/1992 | Kaneko | 307/475 |

FOREIGN PATENT DOCUMENTS

| | | |
|---|---|---|
| 0366294 | 5/1990 | European Pat. Off. . |
| 3929351 | 9/1989 | Germany . |
| 62-12211 | 1/1987 | Japan . |
| 63-90918 | 4/1988 | Japan . |

Primary Examiner—David R. Hudspeth
Assistant Examiner—Andrews Sanders
Attorney, Agent, or Firm—Leydig, Voit & Mayer

[57] ABSTRACT

A semiconductor circuit for converting high and low input signals at first and second voltage levels to high and low output signals at third and fourth voltage levels includes first, second, and third power supply lines receiving driving voltages at first, second, and third voltages, respectively, the third voltage being intermediate the first and second voltages, a first logic circuit connected to and driven by the first and third power supply lines for receiving high and low input signals at first and second voltage levels and producing output signals in response, a second logic circuit connected to and driven by the second and third power supply lines for receiving input signals and producing high and low output signals at third and fourth voltage levels in response, a level converting circuit connected to and driven by the first and second power supply lines, receiving the output signals of the first logic circuit and supplying input signals to the second logic circuit, a switching element and a load element connected in series and to the first and second power supply lines, the junction of the switching and load elements being connected to the second logic circuit, the switching element being connected to and controlled by the first logic circuit, and a clamping circuit connected in parallel with the load element in order to operate at high speed.

5 Claims, 10 Drawing Sheets

DIRECT COUPLED FET LOGIC TRANSLATOR CIRCUIT

FIELD OF THE INVENTION

The present invention relates to semiconductor integrated circuits, and, more particularly, to a level converting circuit included in a Direct Coupled FET Logic (hereinafter referred to as DCFL) type circuit.

BACKGROUND OF THE INVENTIONS

Generally speaking, a DCFL logic circuit is a logic circuit constructed by connecting field effect transistors directly in series or in parallel. In this logic circuit, GaAs metal semiconductor FETs (hereinafter referred to as MESFET) or high electron mobility transistors (hereinafter referred to as HEMT) are employed as constituent transistors. This logic circuit is often driven by $-2$ V power supply. More particularly, when logic signals are input and output between a semiconductor integrated circuit and an external circuit, ECL (Emitter Coupled Logic) levels, in which H level $V_H$ is $-0.9$ V and L level $V_L$ is $-1.7$ V are employed as an input/output level of the logic signals. The semiconductor integrated circuit usually has a structure in which $-2$ V power supply for inputting and outputting at ECL level is supplied from the outside. Therefore, $-2$ V power supply itself is employed in the DCFL logic circuit included in the semiconductor integrated circuit.

A DCFL logic circuit operates sufficiently at a driving voltage of 1 V. For example, when the voltage of the $-2$ V power supply supplied from the outside of the semiconductor integrated circuit is divided inside the circuit into 1 V between power supply voltage $V_{DD}$ (0 V) and $V_{MM}$ ($-1$ V) and 1 V between power supply voltage $V_{MM}$ ($-1$ V) and $V_{TT}$ ($-2$ V), and the DCFL logic circuit is driven at the driving voltage of 1 V, power dissipation of the semiconductor integrated circuit is reduced by lowering the power supply voltage, and if a HEMT is employed in this logic circuit, an increase in delay time is also avoided.

However, when the voltage of $-2$ V power supply is divided into two parts, as described above, and predetermined logic circuits are driven respectively by power supply voltages $V_{MM}$ and $V_{TT}$ and by power supply voltages $V_{DD}$ and $V_{MM}$, the input/output level of the logic circuit in the lower voltage side driven by power supply voltages $V_{MM}$ and $V_{TT}$ has H level $V_H$ of approximately $-1.3$ V and L level $V_L$ of approximately $-1.9$ V. On the other hand, the input/output level of the logic circuit in the higher voltage side driven by power supply voltages $V_{DD}$ and $V_{MM}$ has H level $V_H$ of approximately $-0.3$ V and L level $V_L$ of approximately $-0.9$ V. Therefore, the input/output levels are unfavorably different between the logic circuit in the higher voltage side and the logic circuit in the lower voltage side. Then, in the conventional semiconductor integrated circuit of DCFL logic circuit type, a logic circuit converting an input/output level (hereinafter also referred to as level converting circuit) is provided between the logic circuit in the lower voltage side and the logic circuit in the higher voltage side.

FIG. 9(a) is a diagram illustrating construction of a conventional DCFL logic circuit having a level converting circuit, and FIG. 9(b) is a diagram illustrating a specific circuit of the DCFL logic circuit. In the figures, a DCFL logic circuit 200 includes a lower voltage side inverter 1 driven by $-2$ V power supply $V_{TT}$ and $-1$ V power supply $V_{MM}$, a higher voltage side inverter 3 driven by $-1$ V power supply $V_{MM}$ and 0 V power supply $V_{DD}$, and a level converting inverter 2 which transmits an output from the lower voltage side inverter 1 into the higher voltage side inverter 3 for level conversion. Here, the circuits are designed so that a predetermined node in the logic circuit 200 becomes $-1$ V power supply, $V_{MM}$, as a result of 0 V power supply $V_{DD}$ and $-2$ V power supply $V_{TT}$ supplied from outside.

As shown in FIG. 9(b), a load transistor Q4 and a switching transistor Q5 constituting the lower voltage side inverter 1 are connected in series between $-2$ V power supply $V_{TT}$ and $-1$ V power supply $V_{MM}$. The gate of the transistor Q5 and the connecting node between the transistors Q4 and Q5 are, respectively, an input node IN and an output node N1 of the inverter 1.

A load transistor Q6 and a switching transistor Q7 constituting the higher voltage side inverter 3 are connected in series between 0 V power supply $V_{DD}$ and $-1$ V power supply $V_{MM}$. The gate of the transistor Q7 and the connecting node between the transistors Q6 and Q7 are, respectively, an input node N2 and an output node OUT of the inverter 3.

A load transistor Q1 and a switching transistor Q2, the level converting inverter 2, are connected in series between 0 V power supply $V_{DD}$ and $-2$ V power supply $V_{TT}$. The gate of the transistor Q2 and the connecting node between both transistors are, respectively, an input node N1 of the level converting inverter 2 (the output node of the inverter 1) and an output node N2 of the inverter 2 (the input node of the inverter 3). The source-to-drain resistance of the switching transistor Q2 in its on-state (hereinafter referred to as ON resistance) is approximately one-tenth of the source-to-drain resistance of the load transistor Q1.

Here, as described above, GaAs MESFETs or HEMTs are employed as the transistors Q1, Q2, Q4 to Q7. In these transistors, differently from a metal oxide semiconductor (MOS) transistor, a Schottky junction is present between the gate and source (drain), and the Schottky barrier voltage is around 0.7 V. Further, the transistors Q1, Q4 and Q6 are depletion type transistors, and the transistors Q2, Q5 and Q7 are enhancement type transistors.

FIG. 10(a) is a cross section illustrating a structure of a conventional GaAs MESFET. In the figure, a MESFET 5 has a structure in which a source electrode 6 and a drain electrode 8 are disposed on an n-type GaAs layer 5b that is disposed on a semi-insulating GaAs substrate 5a and a predetermined space is present between a gate electrode 7 and the source and drain electrodes 6 and 8. A Schottky junction is present between the gate electrode 7 and the n-type GaAs layer 5a.

FIG. 10(b) is a cross section illustrating a structure of a conventional HEMT transistor. In the figure, a HEMT 15 has a structure in which a non-doped GaAs layer 15b and a Si-doped AlGaAs layer 15c are successively disposed on a semi-insulating GaAs substrate 15a. A source electrode 16 and a drain electrode 18 are disposed on the AlGaAs layer 15c, and a gate electrode 17 is disposed between and spaced from the electrodes 16 and 18. As in the MESFET, a Schottky junction is present between the gate electrode 17 and the AlGaAs layer 15c.

Next, description is given of the operation.

When the input node IN of the inverter 1 is at H level $V_H$ (−1.3 V), L level $V_L$ (−1.9 V) is output to the output node N1. Then, the inverter 2 receives this L level $V_L$ and outputs H level $V_H$(−0.3 V). After this H level $V_H$ is input to the inverter 3, the output node N3 is at L level $V_L$ (−0.9 V).

On the other hand, when the input node IN of the inverter 1 is at L level $V_L$ (−1.9 V), H level $V_H$ (−1.3 V) is output to the output node N1. Thereby, the level of output node N2 of the inverter 2 is inverted to L level $V_L$ (−1.8 V). After this L level $V_L$ is input to the inverter 3, the output node N3 of the inverter 3 is at H level $V_H$(−0.3 V).

H level $V_H$ and L level $V_L$ of the output node of the inverter 2 in the above-described operations are respectively at around −0.3 V and −1.8 V as described below. More particularly, when L level $V_L$ (−1.9 V) is input to the input node N1 of the inverter 2, i.e., the gate of the transistor Q2, the transistor Q2 is off. Here, a current flowing through the transistor Q1 hardly flows between the drain and the source of the transistor Q2, and flows in a current path through the gate of the transistor Q7 from the drain of the transistor Q1 to the source of the transistor Q7. Therefore, H level at the inverter 2 output is at −0.3 V, which is higher than the source voltage of the transistor Q7 (−1 V), by the Schottky barrier voltage (approximately 0.7 V).

When H level $V_H$(−1.3 V) is input to the transistor Q2, the transistor Q2 is turned on, resulting in a source-to-drain resistance which is around one-tenth of the source-to-drain resistance of the transistor Q1. Therefore, a voltage at output node N2 of the inverter 2 is a value obtained by dividing a differential voltage 2 V between 0 V power supply $V_{DD}$ and −2 V power supply $V_{TT}$ by the source-to-drain resistances of the transistors Q2 and Q1.

More particularly, supposing that the source-to-drain resistance of the load transistor Q1 is $R_1$ (=10r), another ON resistance of the switching transistor Q2 is $R_2$ (=r), the voltage $V_2$ at the output node of the inverter 2 is represented as follows:

$$V_2 = -2 + 2 \times R_2/(R_1 + R_2)$$
$$= -2 + 2 \times r/11r \approx -1.8$$

Therefore, L level at the inverter 2 output is approximately −1.8 V.

As described above, the output level of the level converting inverter 2 comprising the transistors Q1 and Q2 is at H level $V_H$ at around −0.3 V and at L level $V_L$ at around −1.8 V. As a result, the logic voltage swing is approximately 1.5 V.

However, since the DCFL logic circuit conventionally operates with the logic voltage swing of about 0.6 V, if the circuit operates with the logic voltage swing of about 1.5 V like the above-described level converting inverter 2, operating speed is unfavorably decreased. In other words, in the inverter 2, in inverting its output, electrical charges are stored in and drained from the gate of the transistor Q7 or the like, by the transistors Q1 and Q2. However, if this logic voltage swing of the inverter 2 increases, the times required to charge and discharge the gate of transistor Q7 are unfavorably increased in response to an increase in the logic voltage swing, whereby the inverter 2 does not operate at high speed.

FIG. 1 of Japanese Published Patent Application No. 63-90918 discloses a DCFL logic circuit in which a load element R1 and a switching FET 1 are connected in series between higher voltage power supply $V_{DD}$ and lower voltage power supply $V_{SS}$. The gate of the FET serves as an input node and the connecting node between the FET and the load element serves as an output node. A load resistance R2 and an FET 2 are connected in series with each other and in parallel with the load element R1, and negative feedback control of the FET 2 is provided through the FET 3 by the output from the logic circuit to obtain both a high switching speed and operating margin, which are in a trade-off relation. In this logic circuit, however, since a switching element or a feedback path for signals is required to charge the resistance of the load element, the circuit construction for adjusting output level is complicated, unfavorably increasing the area occupied by the logic circuit on the substrate. In addition, in this logic circuit, L level is increased by lowering the resistance value of the load element 1, increasing the power dissipation of the circuit.

SUMMARY OF THE INVENTION

It is an object of the present invention to provide a semiconductor integrated circuit operating at a high operating speed by reducing the logic voltage swing of a level converting circuit, without increasing power dissipation or making the circuit complicated.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to the those skilled in the art from this detailed description.

According to a first aspect of the present invention, in the semiconductor integrated circuit, an output node of a level converting circuit driven by a first power supply and a second power supply having a different voltage is clamped to a voltage higher than L level voltage that is determined according to a load element and a switching element connected in series with each other in the level converting circuit. Therefore, the logic voltage swing of the output of the level converting circuit is reduced, decreasing the times for charging and discharging an input node of a logic circuit at a latter stage of the level converting circuit. As a result, the logic circuit operates at high speed. A circuit for clamping the voltage of the output node is obtained by connecting a diode in parallel with the load element. In a state where the output node is clamped to a predetermined voltage, no current flows through the load element, preventing electric power from being wasted.

According to a second aspect of the present invention, in the semiconductor integrated circuit, a voltage dropping element such as a diode for producing a voltage at a constant level between its ends in turning on, is inserted between a load element which is connected to the second power supply and a switching element which is connected to the first power supply. Therefore, when the switching element is turned on, a voltage of the output node at one end of the load element is shifted to the second power supply side from a voltage determined according to the resistance of the load element and an ON resistance of the switching element, reducing the logic voltage swing of the output of the level converting circuit. As a result, the times required to charge and discharge an input node or the like of logic circuits are shortened, increasing operation speed. This logic circuit operating at high speed is obtained by additionally connecting the voltage dropping element such as a diode to a conventional circuit construction. The voltage dropping element is connected in series with the other elements, not increasing the operating current.

According to a third aspect of the present invention, in the semiconductor integrated circuit, a load transistor having a predetermined gate width or a plurality of load transistors connected in parallel are employed as a load element so that the voltage of the input node of the level converting circuit may be an ideal voltage when the switching element is turned on. Therefore, the level converting circuit operates with the suitable logic voltage swing.

According to a fourth aspect of the present invention, in the semiconductor integrated circuit, a load transistor is employed as the voltage dropping element. Therefore, a voltage produced in turning on, is larger than that of a diode, further reducing the logic voltage swing.

DETAILED DESCRIPTION OF THE PREFERRED EMBODIMENT

Figure 1:
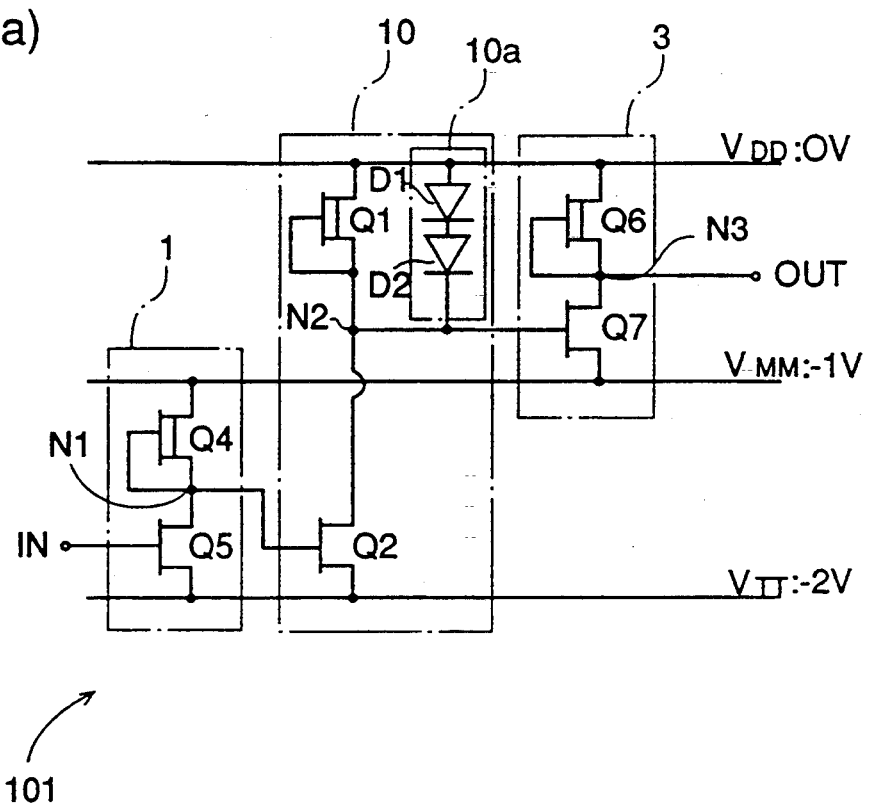
FIGS. 1(a) and 1(b) are diagrams respectively illustrating a specific circuit and the logic construction of a DCFL type logic circuit as a semiconductor integrated circuit in accordance with a first embodiment of the present invention.
Figure 1:
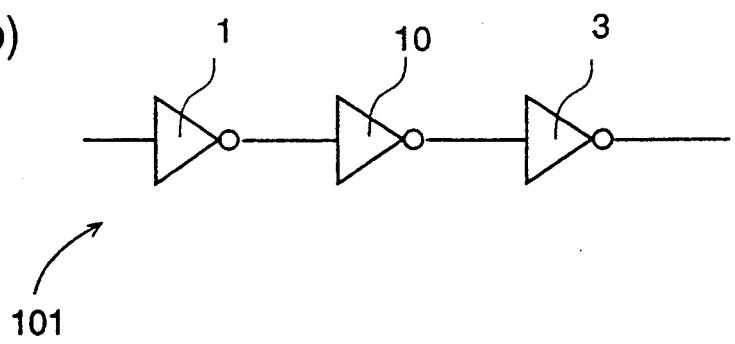
Figure 9:
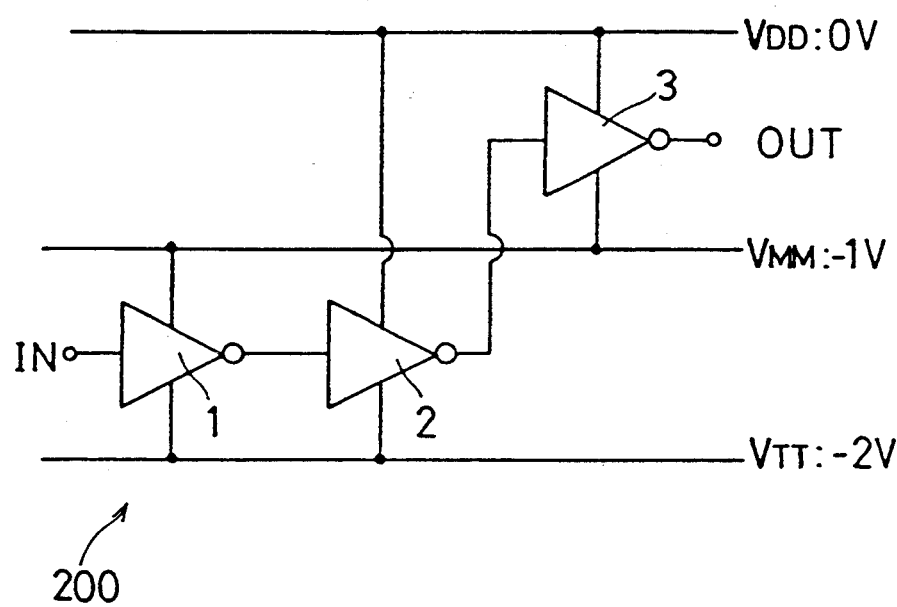
FIGS. 9(a) and 9(b) are diagrams respectively illustrating the logic construction and a specific circuit of a prior art DCFL logic circuit.
Figure 9:
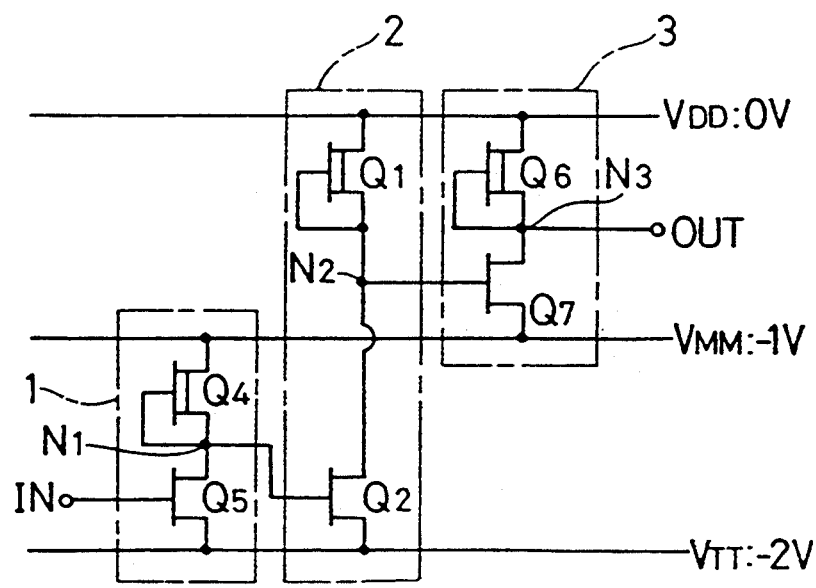

FIGS. 1(a) and 1(b) are diagrams respectively illustrating a specific circuit and the logic construction of a DCFL type logic circuit as a semiconductor integrated circuit in accordance with a first embodiment of the present invention. In the figures, the same reference numerals as those of FIGS. 9(a) and 9(b) designate the same or corresponding parts of the conventional logic circuit 200. A level converting inverter 10 included in a DCFL type logic circuit 101 in accordance with this embodiment, includes a clamping circuit 10a which clamps output node N2 to about $-1.4$ V when the switching transistor Q2 is turned on. In this clamping circuit 10a, diodes D1 and D2, each having a Schottky barrier voltage of around 0.7 V, are connected in series between output node N2 and 0 V power supply $V_{DD}$. The respective diodes D1 and D2 are Schottky diodes, i.e., having a metal to semiconductor junction.

Next, description is given of the operation.

The lower voltage side inverter 1 and the higher voltage side inverter 3 operate in the same way as described above, and only the operation of the level converting inverter 10 is described.

In the logic circuit 101 of this embodiment, H level $V_H$ and L level $V_L$ of the level converting inverter 10 outputs are respectively approximately $-0.3$ V and $-1.4$ V. More particularly, when L level $V_L$ ($-1.9$ V) is input to the input node N1 of the level converting inverter 10, the switching transistor Q2 is off, and similarly to the conventional circuit, the voltage of its output node N2 is $-0.3$ V, which is higher than the source voltage of the transistor Q7 ($-1$ V), by the Schottky barrier voltage (approximately 0.7 V). When H level $V_H$ ($-1.3$ V) is input to the input node N1 of the level converting inverter 10, the switching transistor Q2 is turned on, resulting in a low source-to-drain resistance, which is around one-tenth of the source-to-drain resistance of the load transistor Q1.

Here, the voltage of output node N2 of the level converting inverter 10 is settled at $-1.8$ V by the source-to-drain resistance of the transistor Q2 and the source-to-drain resistance of the transistor Q1. If a voltage between an anode of the diode D1 and a cathode of the diode D2 is over twice as large as the forward voltage of the diode, a current flows along a current path from 0 V power supply $V_{DD}$ to $-2$ V power supply $V_{TT}$ through the diodes D1 and D2 and the transistor Q2. Then, the output level of the level converting inverter 10 is approximately $-1.4$ V, that is lower than the power supply voltage $V_{DD}$ (0 V), by a voltage of twice as large as the forward voltage drop of the diode.

Thus, in this embodiment, the level converting inverter 10 includes the load transistor Q1 and the switching transistor Q2 connected in series between 0 V power supply $V_{DD}$ and $-2$ V power supply $V_{TT}$, and the two diodes D1 and D2 connected in series with each other and in parallel with the load transistor Q1. Therefore, when the switching transistor Q2 is turned on, the voltage of output node N2 of the level converting inverter 10 is clamped to a voltage lower than 0 V power supply VDD by about twice the Schottky barrier voltage of the diode, so that L level $V_L$ is approximately −1.4 V, reducing the logic voltage swing to about 1.1 V. As a result, the times for charging and discharging the input node of the inverter 3 are shortened, increasing operation speeds of the logic circuit. In addition, the clamping circuit 10a for clamping the voltage of the output node is a simple circuit construction with the series-connected diodes D1 and D2 connected in parallel with the load transistor Q1. When output node N2 is clamped to a predetermined voltage, no current flows through the load transistor Q1, also preventing unnecessary consumption of electrical power.

Figure 2:
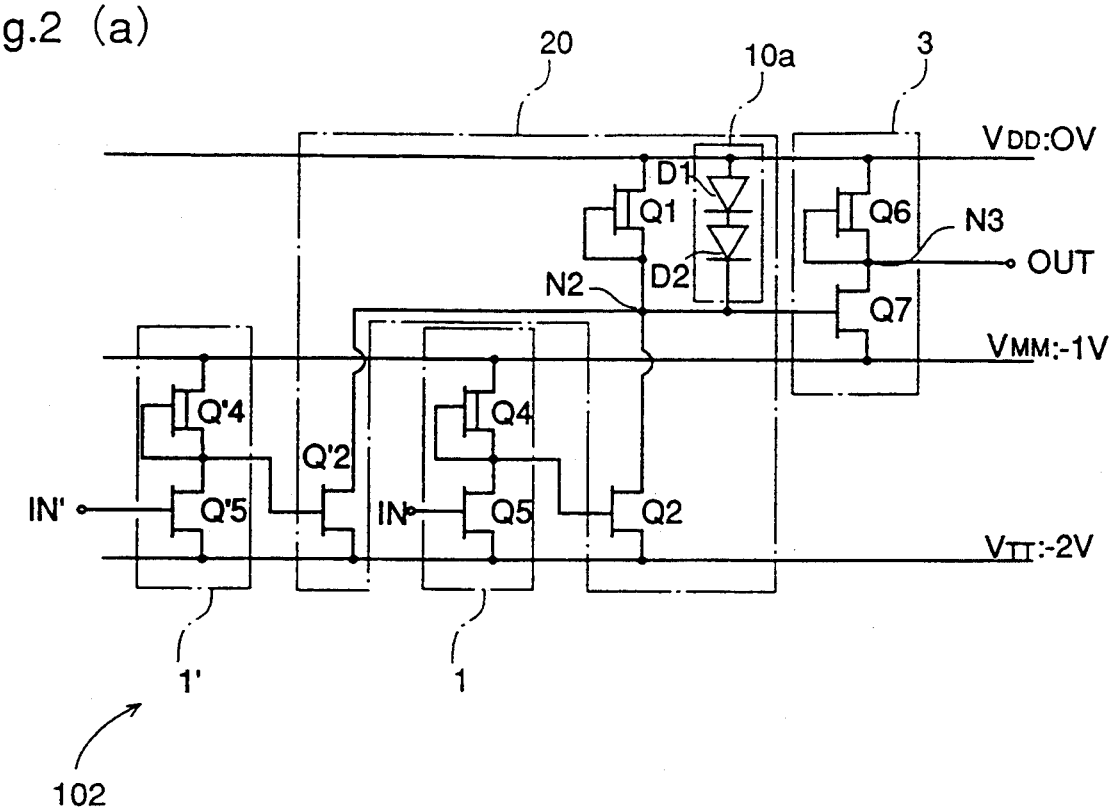
FIGS. 2(a) and 2(b) are diagrams respectively illustrating a specific circuit and the logic construction of a NOR circuit as an example of the logic circuit of FIGS. 1(a) and 1(b) in accordance with a second embodiment of the present invention.
Figure 2:
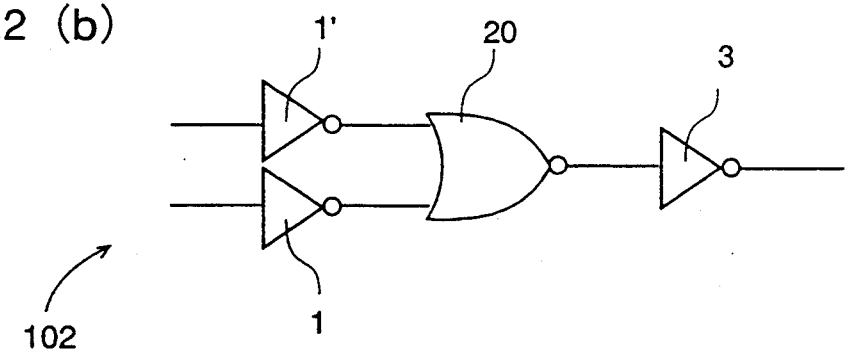

FIGS. 2(a) and 2(b) are diagrams respectively illustrating a specific circuit and the logic construction of a NOR circuit of a DCFL type logic circuit in accordance with a second embodiment of the present invention. In the figures, the same reference numerals as those of FIGS. 1(a) and 1(b) designate the same or corresponding parts. Reference numeral 102 designates a NOR circuit of a DCFL circuit type in accordance with this embodiment. A lower voltage side inverter 1' having the same construction as the lower voltage side inverter 1 is driven by −1 V power supply $V_{MM}$ and −2 V power supply $V_{TT}$, which comprises a load MESFET Q'4 and a switching MESFET Q'5 connected in series between −1 V power supply $V_{MM}$ and −2 V power supply $V_{TT}$. A switching MESFET Q'2 is connected in parallel with the switching MESFET Q2 and is part of a level converting inverter 20. The gate of MESFET Q'2 is connected to an output node of the lower voltage side inverter 1'.

This NOR circuit having such structure has the same effects as the logic circuit of the first embodiment.

Figure 3:
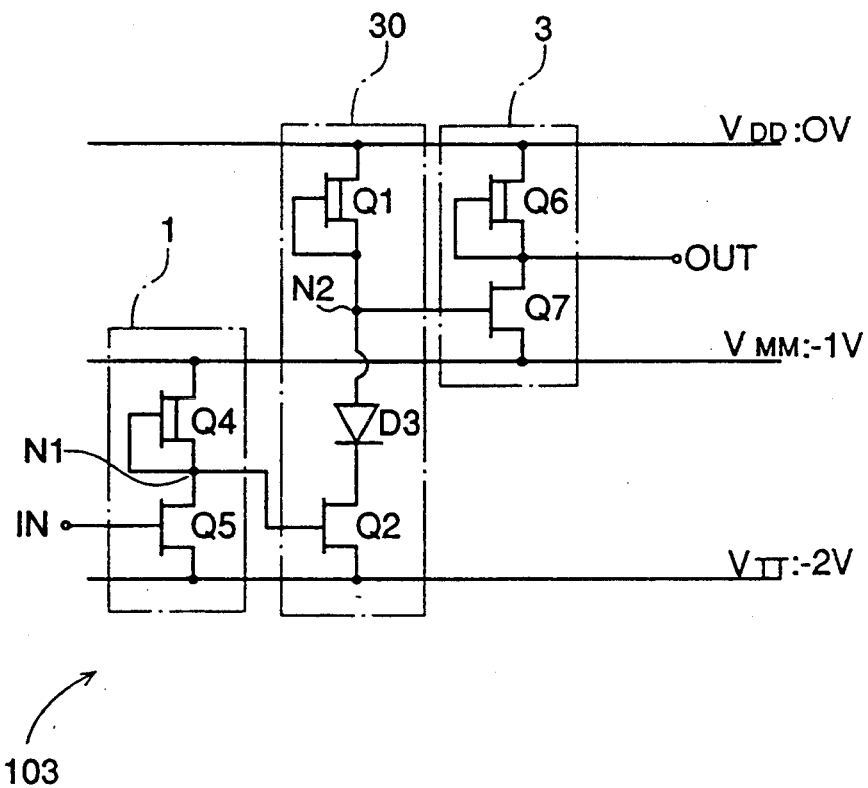
FIGS. 3(a) and 3(b) are diagrams respectively illustrating a specific circuit and the logic construction of a DCFL type logic circuit in accordance with a third embodiment of the present invention.
Figure 3:
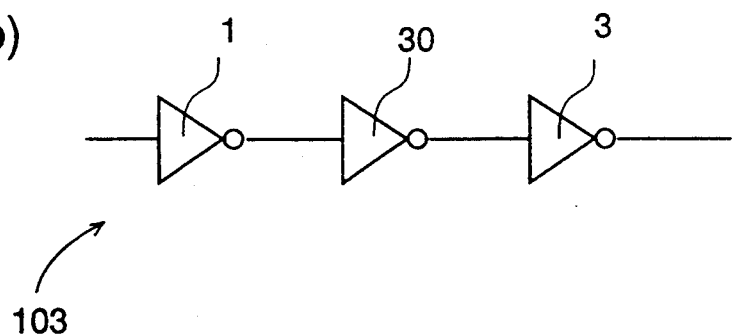

FIGS. 3(a) and 3(b) are diagrams respectively illustrating a specific circuit and a logic construction of a DCFL type logic circuit in accordance with a third embodiment of the present invention. In the figures, the same reference numerals as those of FIGS. 1(a) and 1(b) designate the same or corresponding parts of the logic circuit 101 of the first embodiment. A level converting inverter 30 using a DCFL type logic circuit 103, comprises the load transistor Q1 connected between output node N2 and 0 V power supply $V_{DD}$, and a diode D3 and the switching transistor Q2 connected in series between output node N2 and −2 V power supply $V_{TT}$. The output from the lower voltage side inverter 1 is input to a gate of the switching transistor Q2. The diode D3, with a metal to semiconductor Schottky junction, has a forward voltage of approximately 0.7 V.

Next, description is given of the operation.

The lower voltage side inverter 1 and the higher voltage side inverter 3 operate in the same way as described above, and only the operation of the level converting inverter 30 is described.

In the logic circuit 103 of this embodiment, an output level of the level converting inverter 30, comprising the transistors Q1 and Q2 and the diode D3, has an H level $V_H$ approximately −0.3 V and L level $V_L$ of approximately −1.2 V. More particularly, when L level $V_L$ (−1.9 V) is input to the input node N1 of the level converting inverter 30, the switching transistor Q2 is off, and similarly to the conventional circuit 200, the voltage of output node N2 of the inverter 30 is about −0.3 V, that is higher than the source voltage of the transistor Q7 (−1 V), by the Schottky barrier voltage (approximately 0.7 V). When H level $V_H$ (−1.3 V) is input to the input node N1 of the level converting inverter 30, the switching transistor Q2 is turned on, resulting in a low source-to-drain resistance, which is around one-tenth of the source-to-drain resistance of the transistor Q1.

Here, the forward voltage between the anode and the cathode of the diode D3 is about 0.7 V, and therefore a voltage of 2−0.7=1.3 V is divided by the source-to-drain resistance of the transistor Q1 and the source-to-drain resistance of the transistor Q2. More particularly, supposing that the source-to-drain resistance of the load transistor Q1 is $R_1$ (=10r), and the ON resistance of the switching transistor Q2 is $R_2$ (=r), the voltage $V_2$ at output node N2 of the inverter 30 is represented as follows:

$$V_2 = -1.3 + 1.3 \times R_2/(R_1 + R_2)$$
$$= -1.3 + 1.3 \times r/11r \approx -1.2$$

Therefore, the L level which the inverter 30 outputs to output node is approximately −1.2 V, reducing the logic voltage swing to about 0.9 V.

Thus, in this embodiment, since the diode D3 is connected in series with the switching transistor Q2 between output node N2 of the level converting inverter 30 and −2 V power supply $V_{TT}$, when the switching transistor Q2 is turned on, the voltage of output node N2 at the end of the load transistor Q1 increases by the forward voltage of the diode D3, and the logic voltage swing of the output from the level converting inverter 30 is reduced according to the increased voltage. As a result, the times for charging and discharging the input node N2 of the higher voltage side inverter 3 are shortened, increasing operation speed of the level converting inverter 30. In addition, since this logic circuit operating at high speed is obtained just by adding the diode D3, which is connected in series between the load transistor Q1 and the switching transistor Q2, to the conventional circuit 200, operating current does not increase.

Figure 4:
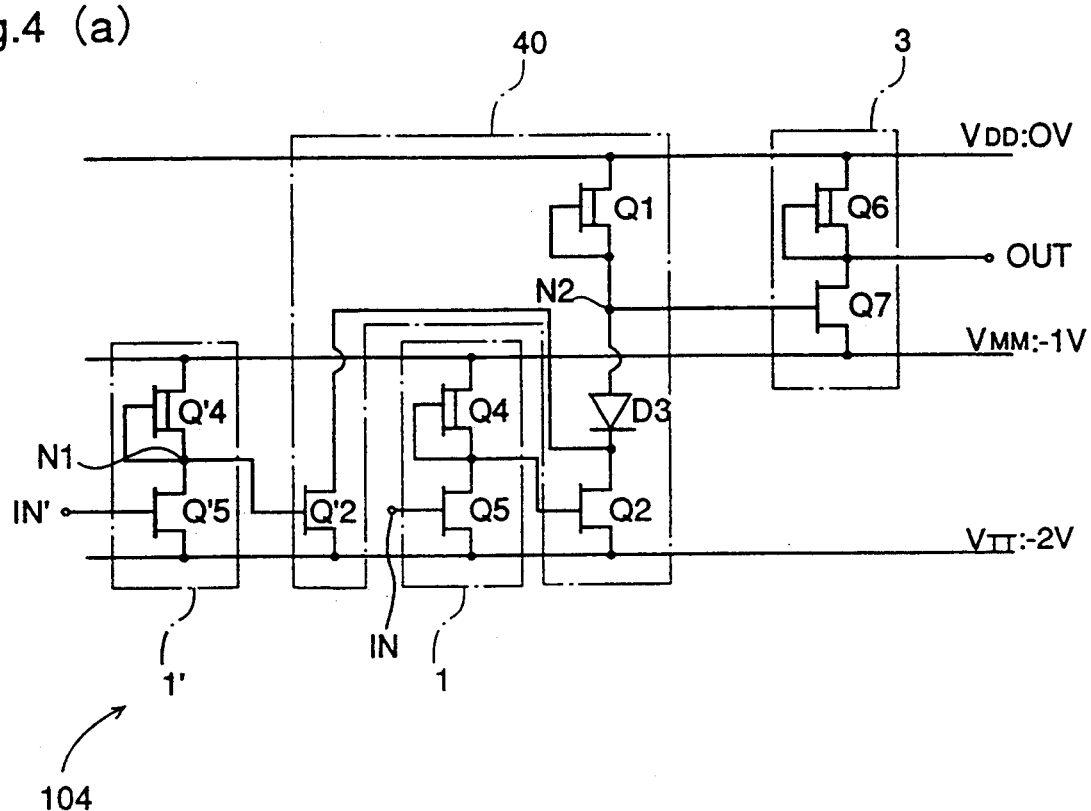
FIGS. 4(a) and 4(b) are diagrams respectively illustrating a specific circuit and the logic construction of a NOR circuit as an example of the logic circuit of FIGS. 3(a) and 3(b) in accordance with a fourth embodiment of the present invention.
Figure 4:
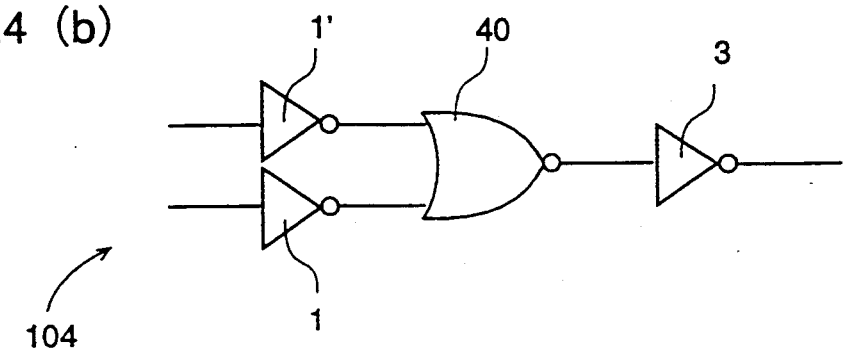

FIGS. 4(a) and 4(b) are diagrams respectively illustrating a specific circuit and the logic construction of a NOR circuit of a DCFL type logic circuit in accordance with a fourth embodiment of the present invention. In the figures, the same reference numerals as those of FIGS. 3(a) and 3(b) designate the same or corresponding parts as the third embodiment. Reference numeral 104 designates a NOR circuit of a DCFL type logic circuit in accordance with this embodiment. In this NOR circuit 104, the switching transistor Q'2 is additionally connected in parallel with the switching transistor Q2 of the level converting inverter 30 of the third embodiment, and the output node of the lower voltage side inverter 1' is connected to a gate of the transistor Q'2.

In the NOR circuit having this structure in accordance with this fourth embodiment, when at least one of the outputs of the lower voltage side inverters 1 and 1' is at L level, the H level and the L level output by the level converting inverter 40 are respectively at −0.3 V and −1.2 V, similar to the third embodiment. When both of the outputs of the lower voltage side inverter 1 and 1' are at H level, the L level which the level converting inverter 40 outputs is a little lower than that of the third embodiment.

More particularly, when both of the outputs of the lower voltage side inverters 1 and 1' are at H level, 1.3

V, given by subtracting the forward voltage of the diode D3 (0.7 V) from a differential voltage (2 V) between the power supplies $V_{DD}$ and $V_{TT}$, is divided across the source-to-drain resistance of the load transistor Q1 and the combined resistance of the source-to-drain resistances of the switching transistors Q2 and Q2′ which are connected in parallel.

Here, supposing that the source-to-drain resistance of the load transistor Q1 is $R_1$ (=10r), the ON resistances of the switching transistors Q2 and Q′2 are $R_2$ (=r), the voltage $V_2$ at output node N2 of the inverter 40 is represented as follows:

$$\begin{aligned} V_2 &= -1.3 + 1.3 \times R_2/2/(R_1 + R_2/2) \\ &= -1.3 + 1.3 \times 0.5r/10.5r \approx -1.23 \end{aligned}$$

Therefore, the L level which the level converting inverter 40 outputs is approximately −1.23 V.

Figure 5:
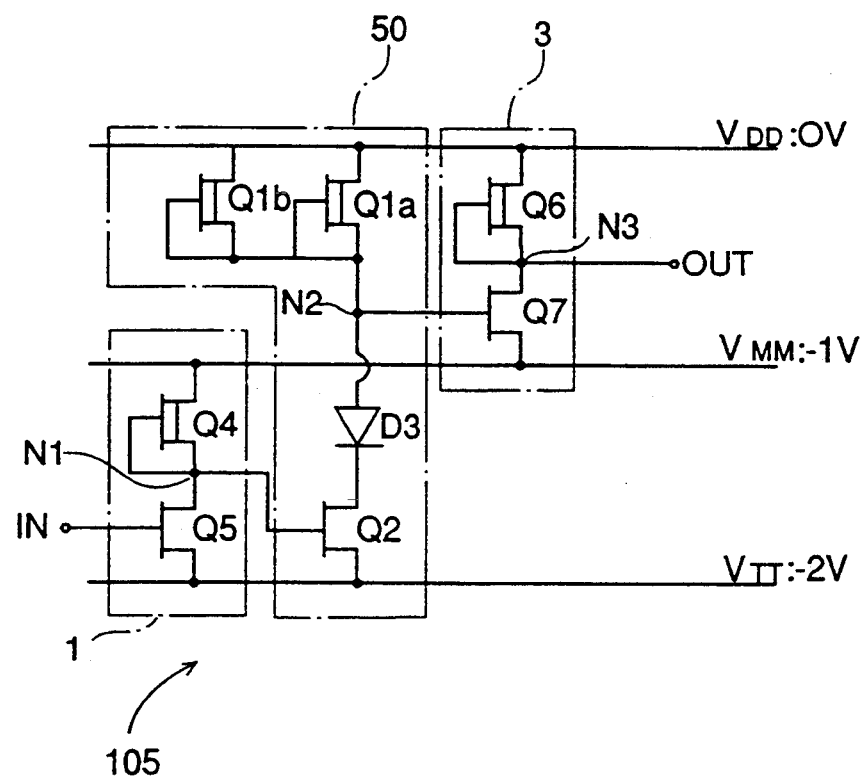
FIGS. 5(a) and 5(b) are diagrams respectively illustrating a specific circuit and the logic construction of a DCFL type logic circuit for adjusting a logic voltage swing of the logic circuit of FIGS. 3(a) and 3(b) in accordance with a fifth embodiment of the present invention.
Figure 5:
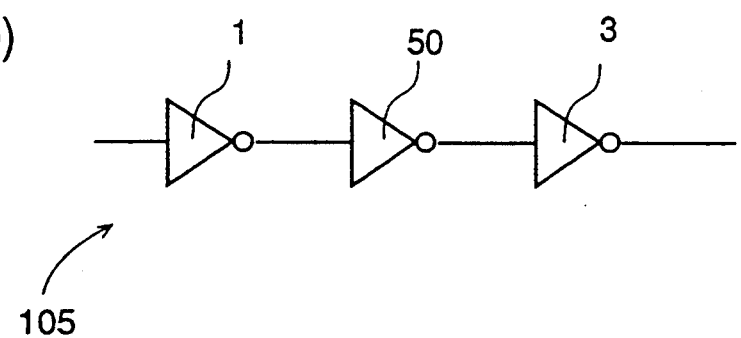

FIGS. 5(a) and 5(b) are diagrams respectively illustrating a specific circuit and the logic construction of a DCFL type logic circuit in accordance with a fifth embodiment of the present invention. In the figures, a level converting inverter 50 using a DCFL type logic circuit 105 includes load transistors Q1a and Q1b having a predetermined gate width, which are connected in parallel with each other, as load elements, so that the voltage of output node N2 may be an ideal voltage. The other circuitry is the same as that of the third embodiment.

In the fifth embodiment having this construction, the level converting inverter 50 operates with more appropriate voltages than the third embodiment.

Figure 6:
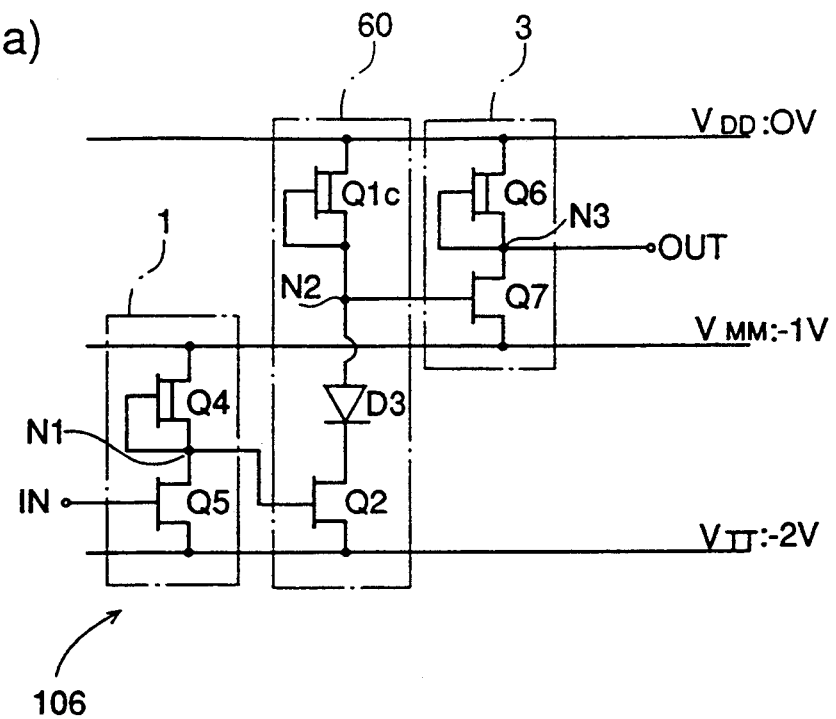
FIGS. 6(a) and 6(b) are diagrams respectively illustrating a specific circuit and the logic construction of a DCFL type logic circuit for adjusting a logic voltage swing of the logic circuit of FIGS. 3(a) and 3(b) in accordance with a sixth embodiment of the present invention.
FIG. 6(c) is a diagram illustrating a structure of a transistor of the logic circuit.
Figure 6:
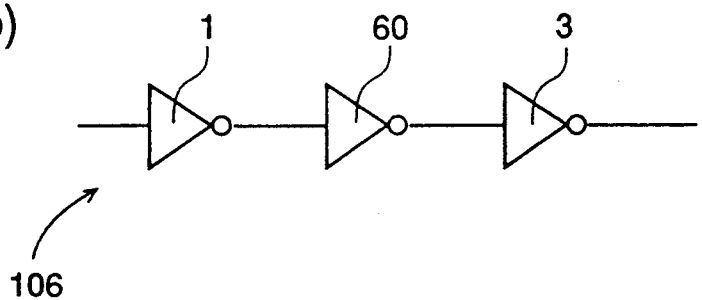
Figure 6:
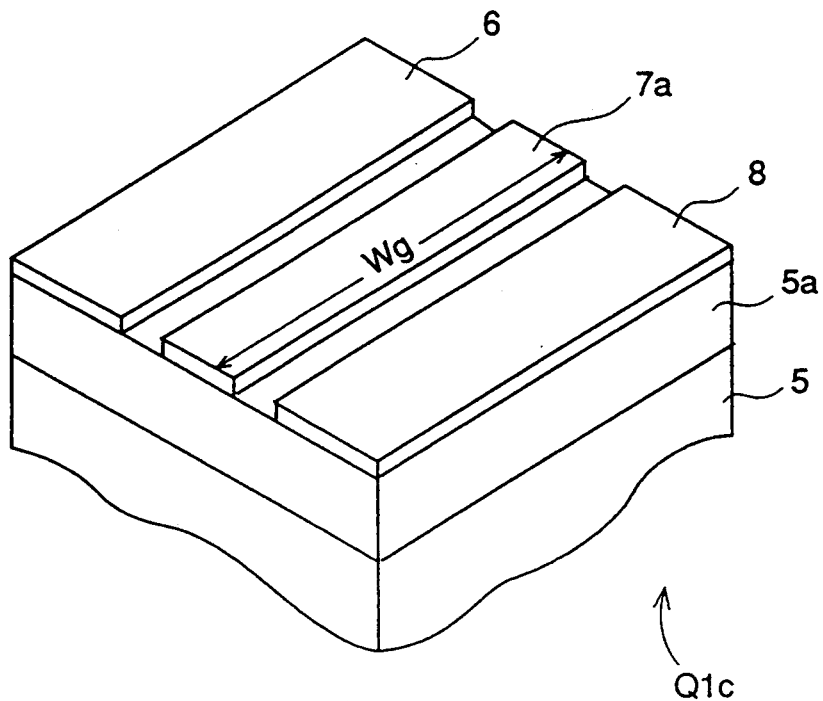
Figure 10:
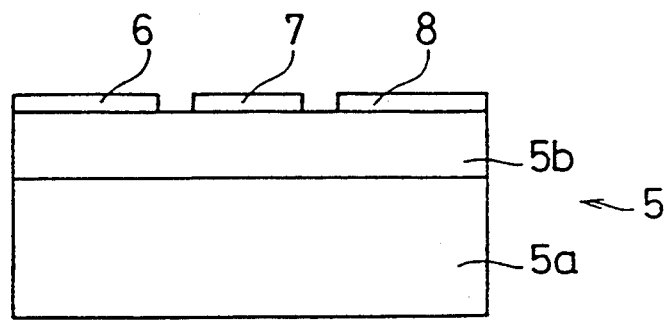
FIG. 10(a) is a cross section illustrating an element structure of a conventional MESFET.
FIG. 10(b) is a cross section illustrating an element structure of a conventional HEMT.
Figure 10:
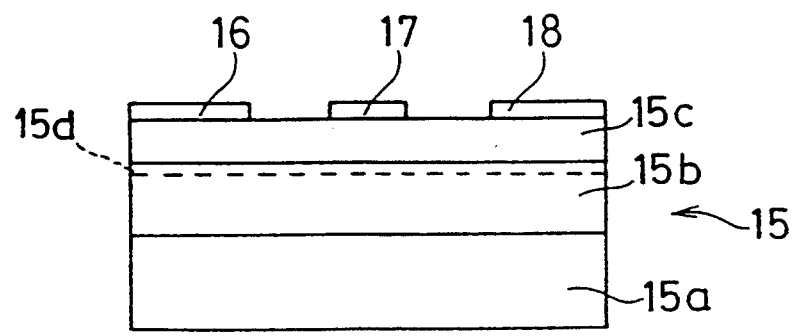

FIGS. 6(a) and 6(b) are diagrams respectively illustrating a specific circuit and the logic construction of a DCFL type logic circuit in accordance with a sixth embodiment of the present invention. FIG. 6(c) is a perspective view for explaining a structure of a load transistor Q1c employed in the logic circuit. In the figures, a level converting inverter 60 using a DCFL type logic circuit 106 includes a load transistor Q1c having a gate width Wg, as illustrated in FIG. 6(c), so that the voltage of output node N2 may be an ideal voltage when the switching transistor Q2 is turned on. The other construction is the same as that of the third embodiment. In FIG. 6(c), the same reference numerals as those of FIG. 10(a) designate the same or corresponding parts.

In the sixth embodiment having this construction, the source-to-drain resistance of the load Q1c is set at a desired value by the gate width Wg, whereby the level converting inverter 60 operates with more appropriate voltages the third embodiment.

Figure 7:
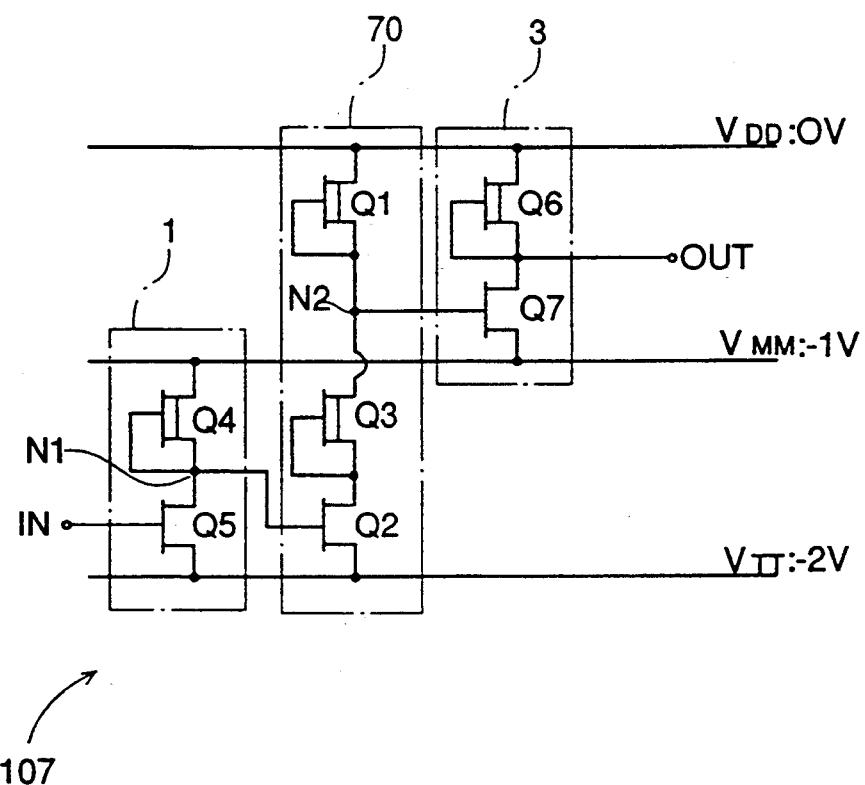
FIGS. 7(a) and 7(b) are diagrams respectively illustrating a specific circuit and the logic construction of a DCFL type logic circuit in accordance with a seventh embodiment of the present invention.
Figure 7:
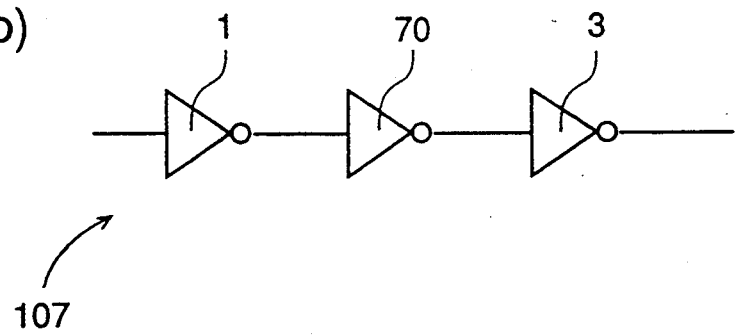

FIGS. 7(a) and 7(b) are diagrams respectively illustrating a specific circuit and a logic construction of a DCFL type logic circuit in accordance with a seventh embodiment of the present invention. In the figures, a level converting inverter 70 using a DCFL type logic circuit 107 includes a depletion type load transistor Q3 in place of the diode D3 using the level converting inverter in the logic circuit 103 in accordance with the third embodiment. This transistor Q3 is produced by the same method as the transistor Q1 so as to be the same size as the transistor Q1.

Next, description is given of the operation.

In this logic circuit 107, the output level of the level converting inverter 70 comprising the transistors Q1 to Q3 is at −0.3 V H level $V_H$ and at around −0.95 V L level $V_L$.

More particularly, when L level $V_L$ (−1.9 V) is input to the input node N1 of the level converting inverter 70, similar to the logic circuit 103 in accordance with the third embodiment, the voltage of output node N2 is approximately −0.3 V, which is higher than the source voltage of the transistor Q7 (−1 V), by the Schottky barrier voltage (about 0.7 V). When H level $V_H$ (−1.3 V) is input to the input node N1 of the level converting inverter 70, the switching transistor Q2 of the inverter 70 is turned on, resulting in a low source-to-drain resistance, which is around one-tenth of the source-to-drain resistance of the load transistor Q1. Here, the 2 V between 0 V power supply $V_{DD}$ and −2 V power supply $V_{TT}$ is divided by the resistance R1 (=10r) of the load transistor Q1, the resistance R3 (=10r) of the load transistor Q3 and the ON resistance R2 (=r) of the switching transistor Q2, to generate a drain-to-source voltage of about 0.95 V in the transistors Q1 and Q3 and a drain-to-source voltage of about 0.1 V in the transistor Q2. As a result, the L level which the level converting inverter 70 outputs is approximately −0.95 V, reducing the logic voltage swing to 0.65 V, close to the ideal voltage swing of 0.6 V.

In this embodiment, by employing the transistor Q3 in place of the diode D3 in accordance with the third embodiment, the logic voltage swing is reduced to close to the ideal logic voltage swing in addition to the advantages of the third embodiment.

Figure 8:
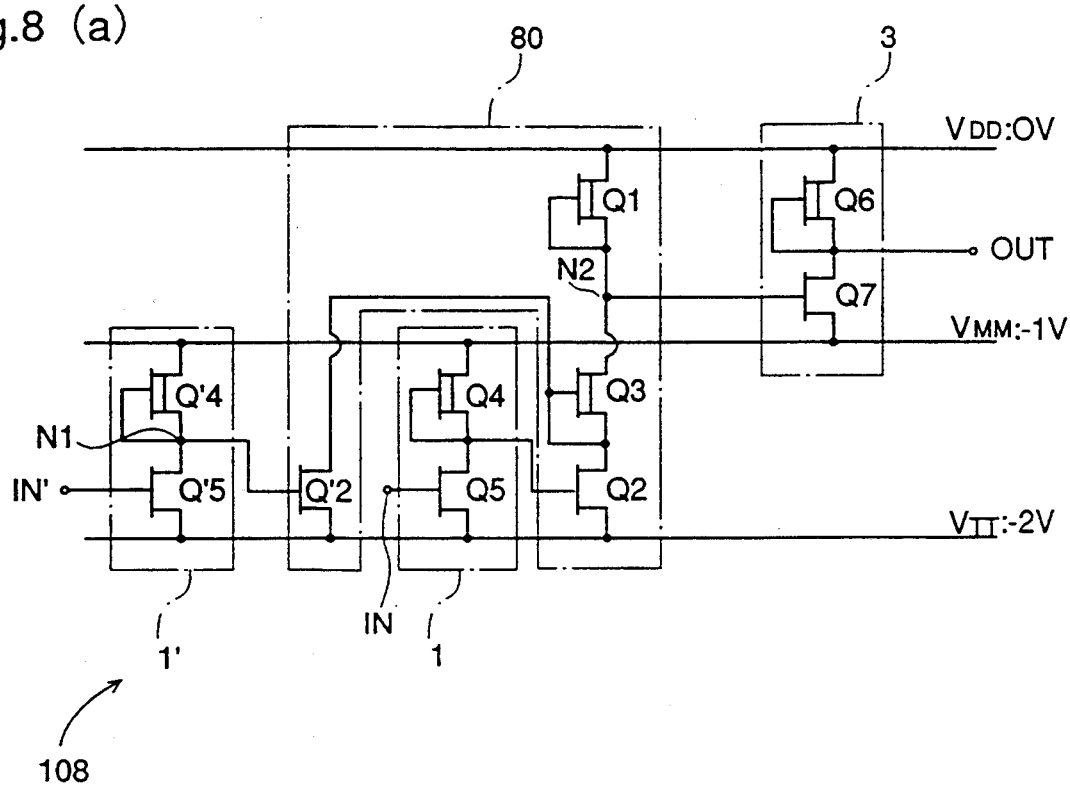
FIGS. 8(a) and 8(b) are diagrams respectively illustrating a specific circuit and the logic construction of a NOR circuit as an example of the logic circuit of FIGS. 7(a) and 7(b) in accordance with an eighth embodiment of the present invention.
Figure 8:
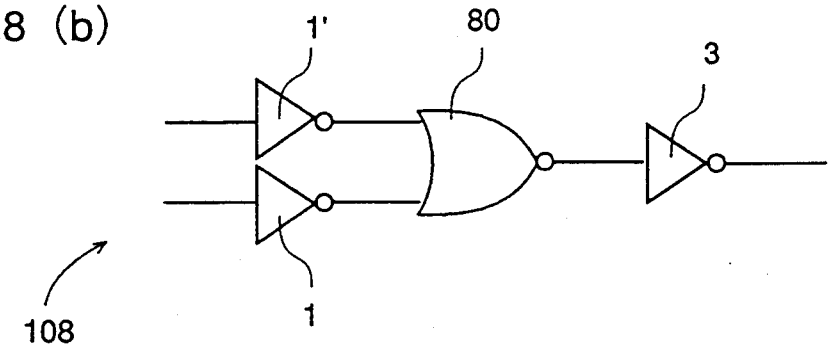

FIGS. 8(a) and 8(b) are diagrams respectively illustrating a specific circuit and the logic construction of a NOR circuit of a DCFL type logic circuit in accordance with an eighth embodiment of the present invention. In the figures, the same reference numerals as those of FIGS. 7(a) and 7(b) designate the same or corresponding parts as the seventh embodiment. Reference numeral 108 designates a NOR circuit of a DCFL type logic circuit in accordance with this embodiment. In this NOR circuit 108, the switching transistor Q′2 is additionally connected in parallel with the switching transistor Q2 of the level converting inverter in accordance with the seventh embodiment, and the gate of the transistor Q′2 is connected to the output node of the lower voltage side inverter 1′.

In this NOR circuit 108 having this construction, when at least one of the outputs of the lower voltage side inverters 1 and 1′ is at L level, the H level and L level which the level converting inverter 80 outputs are respectively −0.3 V and −0.95 V similar to the seventh embodiment. When both outputs of the lower voltage side inverters 1 and 1′ are at H level, however, the L level which the level converting inverter 80 outputs is a little lower than that of the seventh embodiment. More particularly, when both outputs of the lower voltage side inverters 1 and 1′ are at H level, 2 V between the power supply $V_{DD}$ and the power supply $V_{TT}$ is divided by the source-to-drain resistance of the load transistor Q1 and the combined resistance of the source-to-drain resistances of the switching transistors Q2 and Q′2 which are connected in parallel with each other.

Here, supposing that the source-to-drain resistance of the load transistor Q1 is R1 (=10r), the source-to-drain resistance of the load transistor Q3 is R3 (=10r) and the ON resistances of the switching transistors Q2 and Q′2 are R2 (=r), the voltage $V_2$ at output node N2 of the inverter 80 is represented as follows:

$$V_2 = -2 + 2 \times (R_2/2 + R_3)/(R_1 + R_2/2 + R_3)$$
$$= -2 + 2 \times (0.5r + 10r)/(10r + 0.5r + 10r) \approx -0.98$$

Therefore, also in this NOR circuit 108, the L level which the level converting inverter 80 outputs is approximately −0.98 V, reducing the logic voltage swing to 0.68 V, close to the ideal logic voltage swing of 0.6 V.

Further, while a circuit employing a load transistor having a predetermined gate width as a load element in accordance with the fifth embodiment, or the circuit employing a plurality of load transistors connected in parallel as load elements, is applied in the above-described third and fourth embodiments, such a circuit is also employed in the seventh and the eighth embodiments.

What is claimed is:

1. A semiconductor circuit for converting high and low input signals at respective first and second voltage levels to high and low output signals at respective third and fourth voltage levels comprising:

first, second, and third power supply lines for receiving driving voltages at first, second, and third voltages, respectively, the third voltage being intermediate the first and second voltages;

a first logic circuit connected to and driven by the first and third power supply lines for receiving high and low input signals at respective first and second voltage levels and producing output signals in response;

a second logic circuit connected to and driven by the second and third power supply lines for receiving input signals and producing high and low output signals at respective third and fourth voltage levels in response; and a level converting circuit connected to and driven by the first and second power supply lines, receiving the output signals of the first logic circuit, and supplying input signals to the second logic circuit and comprising a switching element and a load element connected in series to each other, the series connection of elements being connected to the first and second power supply lines, the junction of said switching and load elements being connected to the second logic circuit, the switching element receiving the output signal of the first logic circuit; and a clamping circuit connected in parallel with said load element.

2. The simiconductor circuit of claim 1, wherein said claiming circuit comprises two Schottky diodes connected in series with each other.

3. The semiconductor circuit of claim 1, wherein said switching element includes a first transistor having a gate and a second transistor having a gate, said first and second transistors being connected in parallel and said first logic circuit comprises first and second inverters having respective output terminals connected respectively to the gates of said first and second transistors.

4. The semiconductor circuit of claim 3, wherein said load element comprises a plurality of load transistors having predetermined gate widths connected in parallel with each other.

5. The semiconductor circuit of claim 3, wherein said load element is a load transistor having a predetermined gate width so that the input signal supplied by said level converting circuit is an ideal voltage when said switching element is on.

* * * * *

UNITED STATES PATENT AND TRADEMARK OFFICE
CERTIFICATE OF CORRECTION

PATENT NO. : 5,451,888
DATED : September 19, 1995
INVENTOR(S) : Shimada

It is certified that error appears in the above-indentified patent and that said Letters Patent is hereby corrected as shown below:

Column 12, Line 16, change "simiconductor" to --semiconductor--;

Line 17, change "claiming" to --clamping--;

Line 22, after "parallel" insert --,--.

Signed and Sealed this

Sixteenth Day of April, 1996

BRUCE LEHMAN

*Attest:*

*Attesting Officer*  Commissioner of Patents and Trademarks